US006420874B1

(12) United States Patent
Migda et al.

(10) Patent No.: US 6,420,874 B1
(45) Date of Patent: Jul. 16, 2002

(54) ELECTROSTATIC PAINTING SYSTEM AND METHOD

(75) Inventors: Frank Migda, Commerce Township; Dimitar P. Filev, Novi; Mackenzie Endo, Ann Arbor, all of MI (US)

(73) Assignee: Ford Global Tech., Inc., Dearborn, MI (US)

( * ) Notice: Subject to any disclaimer, the term of this patent is extended or adjusted under 35 U.S.C. 154(b) by 4 days.

(21) Appl. No.: 09/625,589

(22) Filed: Jul. 26, 2000

(51) Int. Cl.[7] .................................................. G01R 27/26

(52) U.S. Cl. .......................................... 324/452; 324/509

(58) Field of Search .................................. 324/452, 509, 324/61 R, 158.1; 239/690.1; 427/475; 118/694, 629, 630

(56) References Cited

U.S. PATENT DOCUMENTS

| | | | | | |
|---|---|---|---|---|---|
| 3,611,122 | A | | 10/1971 | Pahl, Jr. | 324/54 |
| 4,857,853 | A | | 8/1989 | Cook, Jr. | 324/456 |
| 5,196,067 | A | * | 3/1993 | Lacchia | 118/694 |
| 5,443,642 | A | * | 8/1995 | Bienduga | 118/688 |
| 5,598,099 | A | | 1/1997 | Castleman et al. | 324/456 |
| 5,717,310 | A | * | 2/1998 | Sakai et al. | 320/15 |
| 5,750,011 | A | * | 5/1998 | Ohmi et al. | 204/164 |
| 5,818,236 | A | * | 10/1998 | Sone et al. | 324/509 |
| 5,832,411 | A | * | 11/1998 | Schatzmann et al. | 702/23 |
| 5,949,235 | A | * | 9/1999 | Castleman et al. | 324/509 |

* cited by examiner

*Primary Examiner*—Michael Sherry
*Assistant Examiner*—Jimmy Nguyen
(74) *Attorney, Agent, or Firm*—Ford Global Tech., Inc.

(57) ABSTRACT

A system 10 for electrostatically painting a product or vehicle 12. The system 10 ensures that each product or vehicle 12 which is painted is sufficiently and completely grounded prior to being painted, thereby substantially preventing the products or vehicles 12 from being improperly painted and improving the overall efficiency of the painting process.

17 Claims, 2 Drawing Sheets

ELECTROSTATIC PAINTING SYSTEM AND METHOD

FIELD OF THE INVENTION

This invention generally relates to an electrostatic painting system and method and more particularly, to an electrostatic painting system and method that accurately detects ground failures in portions of products or vehicles that are being painted.

BACKGROUND OF THE INVENTION

During the manufacture of products, such as automotive vehicles, the products or vehicles are individually painted in a desired manner by use of a particular painting process, method and/or system. One type of painting process or system, commonly referred to as a high voltage electrostatic painting process or system, utilizes electrically charged paint particles to improve the efficiency and quality of the painting process. In this type of painting process, the product or vehicle to be painted is "grounded" (e.g., is coupled to an electrical ground potential) and/or is attached to a grounded fixture. The product or vehicle is sent through one or more painting booths which selectively apply coats of paint to the product or vehicle. The paint is electrostatically charged at a relatively high voltage prior to atomization. Once the paint is discharged or atomized, the charged paint particles are "drawn" or attracted to the grounded vehicle or product by electrostatic forces. In this manner, a lesser amount of paint is required to paint the product or vehicle, and the product or vehicle is painted more evenly and efficiently with less waste.

While this type of electrostatic painting process and/or system is effective to more efficiently and evenly paint a product or vehicle, it suffers from some drawbacks. For example and without limitation, oftentimes portions of the target product or vehicle become "ungrounded" during the painting process. When this occurs, the product or vehicle will often exhibit non-uniform paint coverage and appearance and inferior quality. When non-conductive products or components are painted, robust grounding is even more critical, as the "ungrounding" of a single part or portion of a component will cause surrounding parts to have poor paint coverage, thereby requiring the entire product or unit to be repainted.

Efforts have been made to detect the presence of an ungrounded condition in vehicles or products that are being electrostatically painted. For example and without limitation, visual inspections of the products or vehicle area typically performed during the painting process in order to ensure that the product or vehicle is sufficiently grounded. However, it is relatively difficult to visually detect or discern whether a portion of a product or vehicle becomes ungrounded after the painting process is completed. Particularly, these ungrounded conditions can typically be detected only after the product or vehicle has completed its cure cycle, when a film thickness is measured, or when a field failure (i.e., peeling) occurs due to thin film coverage. This "late" or "delayed" detection requires the vehicle to be completely repainted, undesirably increases the cost and time required to complete the painting process, and decreases the efficiency of the overall painting process. Other attempts at detecting the "ungrounding" of a portion or component of a vehicle include the use of conventional probes which are coupled to the vehicle. These probes, however, do not work on all types of products or vehicles and often provide inconsistent results.

There is therefore a need for an electrostatic painting system and method which is adapted for use in combination with a product or vehicle and which substantially ensures that the product or vehicle is sufficiently grounded during the painting process.

SUMMARY OF THE INVENTION

It is a first object of the invention to provide an electrostatic painting system and method which overcomes the drawbacks of prior systems and methods.

It is a second object of the invention to provide an electrostatic painting system and method which substantially ensures that a product or vehicle is sufficiently grounded prior to being painted.

It is a third object of the invention to provide an electrostatic painting system and method which utilizes an electrostatic volt meter to automatically identify ground failures in a product or vehicle before applying paint to the product or vehicle.

According to a first aspect of the present invention, a system for electrostatically painting a product is provided. The system includes a first station which selectively applies electrical charge to the product; a second station including at least one sensor which detects whether any portion of the product is electrically charged and which automatically generates a signal in response to the detection; and an electrostatic painting booth which selectively applies paint to the product. The system further includes a computer which is communicatively coupled to the at least one sensor and which is effective to receive the generated signal, the computer being further effective to selectively deactivate the painting booth based upon the received signal, thereby selectively preventing the product from being painted when any portion of the product is ungrounded.

According to a second aspect of the present invention, a method is provided for detecting ground failures in a product which is painted by an electrostatic painting process. The method includes the steps of: selectively applying an electrical charge to the product, effective to cause any ungrounded portion of the product to retain a residual voltage; and determining whether any portion of the product has a residual voltage, thereby detecting any ground failures within the product.

These and other objects, aspects, features, and advantages of the present invention will become apparent from a consideration of the following specification and the attached drawings.

DETAILED DESCRIPTION OF THE PREFERRED EMBODIMENT OF THE INVENTION

Figure 1:
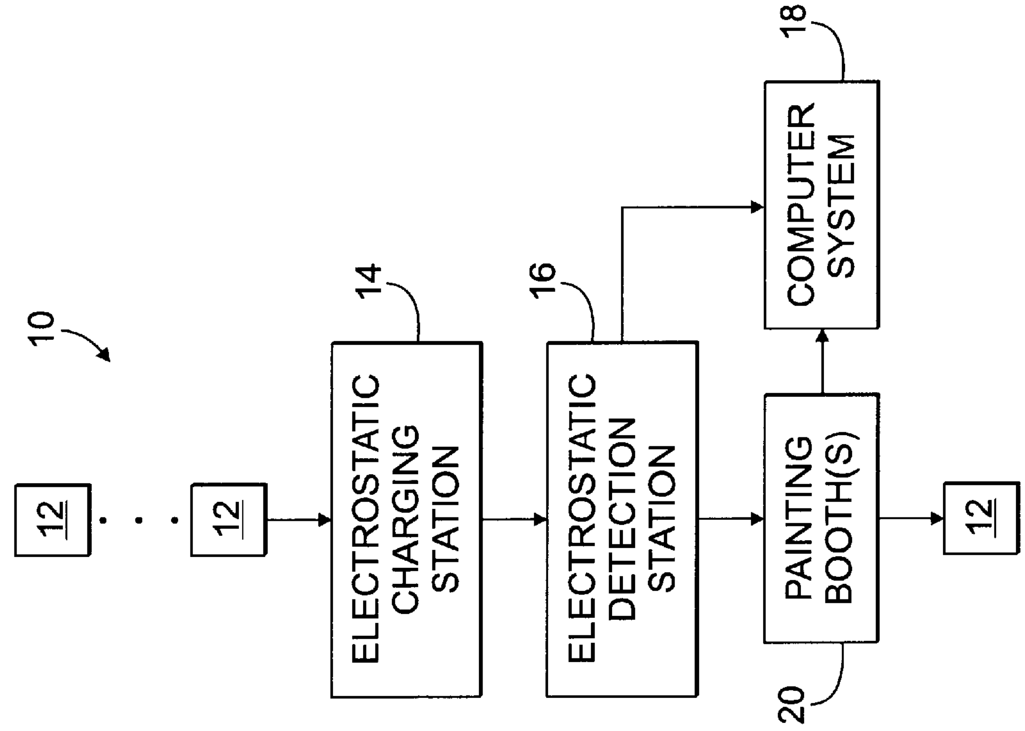
FIG. 1 is a block diagram illustrating an electrostatic painting system which is made in accordance with the teachings of the preferred embodiment of the invention.

Referring now to FIG. 1, there is shown an electrostatic painting system 10 which is made in accordance with the teachings of the preferred embodiment of the invention. In the preferred embodiment, system 10 is used to electrostatically paint products 12 during a manufacturing process. As described more fully and completely below, system 10 accurately and automatically detects grounding failures in the products 12 and prevents products which are not properly and/or completely grounded from being painted. In the preferred embodiment of the invention, the painted products 12 comprise automotive vehicles, vehicle bodies and/or vehicle components. In alternate embodiments, products 12 may comprise any type of product which is desirably painted.

System 10 includes an electrostatic charging station, region or area 14, an electrostatic detection station, region or area 16, a conventional controller or computer system 18, and one or more conventional painting booths 20. As described more fully and completely below, computer system 18 is communicatively coupled to and selectively receives data from one or more electrostatic voltmeters within area 16. Computer system 18 is further communicatively coupled to painting booths 20, and is effective to control the application of paint which is performed by and/or within the painting booths 20.

Figure 2:
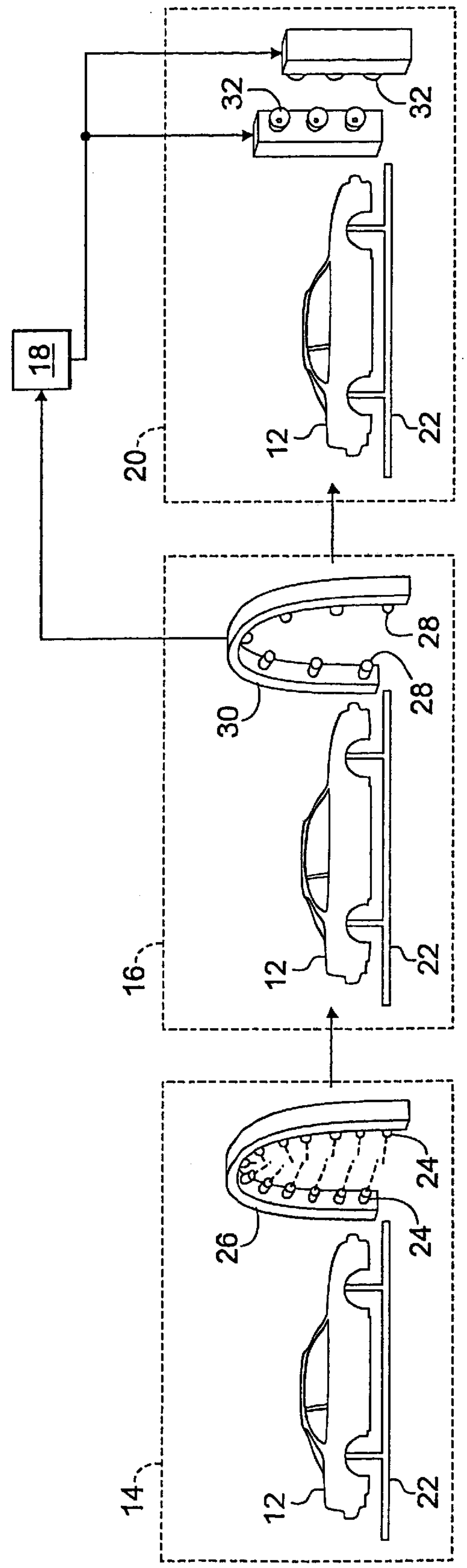
FIG. 2 is a schematic diagram illustrating the electrostatic painting system shown in FIG. 1.

Referring now to FIG. 2, in the preferred embodiment of the invention, each vehicle 12 is attached to a "grounded" fixture 22 (e.g., a fixture which is connected to an electrical ground potential). The fixtures 22 and/or vehicles are arranged and/or interconnected in an conventional assembly line or a conveyor assembly (not shown) which carries and/or transports the vehicles 12 through system 10.

As shown best in FIG. 2, in the preferred embodiment of the invention, electrostatic charging station 14 includes an array of ionized air blowers or dischargers 24, which are effective to blow or discharge ionized air onto the vehicle 12. The air or gas that is applied to (e.g., blown onto) vehicle 12 is effective to electrically (e.g., negatively) charge any "ungrounded" portion of the vehicle 12 to a relatively high voltage. In the preferred embodiment of the invention, the blowers 24 are conventional fans or blowers and are arranged in and/or are mounted upon an arch or a "halo" member 26 which is formed around a portion of the assembly line. In this manner, the conveyor assembly transports vehicles 12 through halo 26 and/or in relative close proximity to blowers 24. Blowers 24 receive the ionized air or gas from a conventional pressurized source or supply (not shown). In other alternate embodiments, electrostatic charging area or region 14 includes different types of charging devices (e.g., robots or robotic applicators), which are effective to transfer electrical charge to portions of the vehicle 12.

In the preferred embodiment of the invention, electrostatic detection station or region 16 includes several electrostatic voltmeters or sensors 28 which are effective to detect and measure the presence of electrical charge or residual voltage (e.g., on portions of vehicle 12). In the preferred embodiment of the invention, an array of electrostatic voltmeters 28 are arranged in and/or mounted upon an arch or a "halo" member 30 which is formed around a portion of the assembly line. In this manner, the conveyor assembly transports vehicles 12 through halo 30 and/or in relative close proximity to sensors 28. In other alternate embodiments, electrostatic detection area 16 includes different types of devices which are effective to detect whether portions of vehicle 12 carry an electrical charge or residual voltage. In one non-limiting embodiment, the electrostatic voltmeters 28 are attached to robots which move the voltmeters 28 around the various portions of the vehicles 12, thereby scanning the vehicles 12 for residual charge.

In the preferred embodiment, painting booth(s) 20 include one or more conventional electrostatic painting booths. Each booth 20 includes several robotic, manual and/or "bell" type paint applicators 32 which are effective to apply one or more layers of conventional paint (e.g., a base coat, a clear coat, primer, and/or an "E-coat") to vehicles 12. The paint booths 20 may include any type of solid and/or liquid electrostatic paint application systems, including solvent borne, waterborne, and powder paint ("tribocharging") systems.

In operation, products or vehicles 12 are "grounded" and/or are attached to conventional grounded fixtures 22. Products or vehicles 12 which are manufactured from conventional metallic materials are grounded in a conventional manner (e.g., all portions of the vehicle are connected to an electrical ground potential). Non-metallic (e.g., plastic) portions of vehicles 12 are first treated with a conventional metallic primer, which is effective to allow the non-metallic portions of the vehicles 12 to be grounded, and are subsequently grounded and attached to fixtures 22 or to other grounded portions of vehicle 12.

Vehicles 12 are then transported through electrostatic charging area 14 where they are treated with ionized or charged air or gas (e.g., by use of blowers 24 and halo 26). As should be appreciated by one of ordinary skill in the art, if a vehicle 12 is fully and completely grounded (e.g., if all portions and components of the vehicle 12 are properly connected to an electrical ground potential), the electrical charge that is applied to the vehicle will be relatively quickly dissipated and/or dispersed. However, if any portion of the vehicle is not properly or sufficiently grounded, that portion of the vehicle will retain the charge that has been applied to it.

The vehicles 12 are then transported to the electrostatic detection area 16. Particularly, vehicles 12 are brought in close proximity to the electrostatic voltmeters 28. Upon detection of a charged portion or component of a vehicle 12 (e.g., a residual voltage on a portion or component of a vehicle 12), each of the sensors 28 which detected the charge or residual voltage selectively generates and communicates a signal to computer system 18. In the preferred embodiment of the invention, the signals sent by sensors 28 correspond to the amount of residual voltage detected by the sensors and the precise location where the residual voltage was detected.

Computer 18 receives the signals from voltmeters 28, and based upon the values of the signals, computer 18 is able to determine the exact portion, part or component of a vehicle 12 which is not properly grounded. Upon such a detection, computer 18 communicates a signal to paint booths 20 effective to disable the paint booths 20 until the "ungrounded" vehicle passes through the booths 20. In this manner, the "ungrounded" vehicle will not be painted, thereby preventing the vehicle from being improperly painted and preventing the unnecessary use of paint.

Additionally, computer 18 identifies the vehicle 12 containing the "ungrounded" portion or component, and the identity of the vehicle 12 and the description of the "ungrounded" portion of vehicle 12 is recorded and stored within computer system 18. In one non-limiting embodiment, this information is indexed or referenced by the identification number of the product or vehicle 12. The recorded and stored information is then displayed, printed or otherwise communicated to appropriate personnel, so that the "ungrounded" portion or component of the vehicle 12 can be properly grounded. The fully and completely grounded vehicle 12 can then be repainted.

In one non-limiting embodiment, multiple electrostatic charging stations 14 and electrostatic detection stations 16 are used within a single painting process or assembly line. For example and without limitation, a pair of stations 14, 16 can be utilized to ensure that the vehicle 12 is properly grounded before each booth, stage or coat in the painting process (e.g., primer coating, base coating, e-coating, and clear coating).

It should be understood that Applicants' invention is not limited to the exact system and method which has been described herein, but that various changes and/or modifications may be made without departing from the spirit and/or the scope of Applicants' invention.

What is claimed is:

1. A system for electrostatically painting a product, said system comprising:

a first station which selectively applies electrical charge to said product;

a second station including at least one sensor which detects whether any portion of said product is electrically charged, determines the exact location on said product which is electrically charged, and automatically generates a first and a second signal in response to said detection;

an electrostatic painting booth which selectively applies paint to said product; and a computer which is communicatively coupled to said at least one sensor and to said painting booth, said computer being effective to receive said first generated signal to selectively deactivate said painting booth based upon said first signal thereby selectively preventing said product from being painted when any portion of said product is ungrounded, said computer further being effective to receive said second signal to record said exact location of said product which is electrically charged.

2. The system of claim 1 wherein said first station applies ionized air to said product, effective to negatively charge any portion of said product which is ungrounded.

3. The system of claim 2 wherein said first station comprises a plurality of blowers arranged in a halo configuration.

4. The system of claim 3 wherein said at least one sensor comprises a plurality of electrostatic voltmeters arranged in a halo configuration.

5. The system of claim 1 further comprising an electrically grounded fixture on which said product is selectively mounted.

6. The system of claim 5 wherein said fixture is attached to a conveyor assembly.

7. The system of claim 1 wherein said product comprises an automotive vehicle.

8. A system for electrostatically painting a vehicle, said system comprising:

at least one blower which is effective to discharge ionized gas onto said vehicle, said ionized gas being effective to cause any ungrounded portion of said vehicle to retain a residual voltage;

at least one voltage sensor which is effective to detect whether any portion of said vehicle has a residual voltage, and to automatically generate a first and a second signal in response to said detection;

an electrostatic painting booth which is effective to selectively apply paint to said vehicle; and a computer which is effective to receive said first and said second signal and to automatically deactivate said painting booth in response to said first received signal, thereby preventing said vehicle from being painted if any portion of said vehicle is ungrounded, said computer being further effective to receive and record said second signal, thereby allowing a precise location of an electrical ground failure upon said vehicle to be realized.

9. The system of claim 8 further comprising:

a conveyor assembly which selectively transports said vehicle in relative close proximity to said at least one blower and to said at least one voltage sensor, and through said painting booth.

10. The system of claim 8 wherein said conveyor assembly includes a grounded fixture to which said vehicle is selectively attached.

11. The system of claim 8 wherein said at least one blower comprises a plurality of blowers which are mounted upon a halo member.

12. The system of claim 8 wherein said at least one voltage sensor comprises a plurality of electrostatic voltmeters.

13. The system of claim 12 wherein said plurality of electrostatic voltmeters are mounted to a halo member.

14. A method for detecting ground failures in a product which is painted by an electrostatic painting process, said method comprising the steps of:

selectively applying an electrical charge to said product, effective to cause any ungrounded portion of said product to retain a residual voltage; determining whether any portion of said product has a residual voltage, thereby detecting any ground failures within said product; and providing a computer which records the exact location of said ground failures , thereby allowing a user to immediately locate and correct any of said ground failures.

15. The method of claim 14 wherein said electrical charge is selectively applied to said product by use of an ionized gas.

16. The method of claim 15 further comprising the steps of:

providing a paint applicator for selectively painting said product; and automatically disabling said paint applicator if any ground failure has been detected.

17. The method of claim 16 further comprising the steps of:

providing at least one voltmeter which is effective to determine whether any portion of said product has a residual voltage and to generate a signal in response to such a determination; and providing a controller which receives said signal and which selectively disables said paint application in response to said receipt of said signal.

* * * * *